US012255169B2

(12) United States Patent
Yao et al.

(10) Patent No.: US 12,255,169 B2
(45) Date of Patent: Mar. 18, 2025

(54) NITRIDE-BASED SEMICONDUCTOR MODULE AND METHOD FOR MANUFACTURING THE SAME

(71) Applicant: INNOSCIENCE (SUZHOU) TECHNOLOGY CO., LTD., Suzhou (CN)

(72) Inventors: Weigang Yao, Suzhou (CN); Chunhua Zhou, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 472 days.

(21) Appl. No.: 17/624,355

(22) PCT Filed: May 6, 2021

(86) PCT No.: PCT/CN2021/091952
§ 371 (c)(1),
(2) Date: Jan. 3, 2022

(87) PCT Pub. No.: WO2022/233000
PCT Pub. Date: Nov. 10, 2022

(65) Prior Publication Data
US 2023/0354525 A1      Nov. 2, 2023

(51) Int. Cl.
*H01L 23/00*      (2006.01)
*H01L 21/48*      (2006.01)
(Continued)

(52) U.S. Cl.
CPC .......... *H01L 24/72* (2013.01); *H01L 21/4853* (2013.01); *H01L 23/13* (2013.01);
(Continued)

(58) Field of Classification Search
CPC ...................................................... H01L 24/72
(Continued)

(56) References Cited

U.S. PATENT DOCUMENTS

| 5,176,525 A |   | 1/1993 | Nierescher et al. |
| 6,137,184 A | * | 10/2000 | Ikegami ................ H01L 21/563 |
|             |   |         | 257/781 |

(Continued)

FOREIGN PATENT DOCUMENTS

| CN | 103489802 A | 1/2014 |
| CN | 106711094 A | 5/2017 |

(Continued)

OTHER PUBLICATIONS

United States Patent and Trademark Office, Non-Final Office Action Issued in U.S. Appl. No. 17/567,845, Sep. 26, 2023, 15 pages.
(Continued)

*Primary Examiner* — Ajay Arora
(74) *Attorney, Agent, or Firm* — McCoy Russell LLP

(57) ABSTRACT

The present disclosure provides a semiconductor module comprising a semiconductor device removably pressed-fit in a cavity formed in a printed circuit board and methods for manufacturing the same. The semiconductor device and the cavity of the printed circuit board can cooperate with each other and act as an electrical plug and an electrical socket respectively. Soldering the semiconductor device on the printed circuit board can be avoided. Therefore, the packaging process can be more flexible and reliability issues with solder joints can be eliminated. Moreover, heatsink can be mounted on top and/or bottom of the semiconductor device after being received in the cavity of the printed circuit board. Thermal dissipation efficiency can be greatly enhanced.

9 Claims, 16 Drawing Sheets

(51) Int. Cl.

| | | |
|---|---|---|
| *H01L 23/13* | (2006.01) | |
| *H01L 23/31* | (2006.01) | |
| *H01L 23/367* | (2006.01) | |
| *H01L 23/498* | (2006.01) | |
| *H05K 1/02* | (2006.01) | |
| *H05K 1/11* | (2006.01) | |
| *H05K 1/18* | (2006.01) | |
| *H05K 3/32* | (2006.01) | |

(52) U.S. Cl.
CPC ...... *H01L 23/3107* (2013.01); *H01L 23/3672* (2013.01); *H01L 23/49811* (2013.01); *H01L 23/49844* (2013.01); *H01L 24/90* (2013.01); *H05K 1/021* (2013.01); *H05K 1/111* (2013.01); *H05K 1/183* (2013.01); *H05K 1/184* (2013.01); *H05K 3/325* (2013.01); *H05K 2201/1059* (2013.01); *H05K 2201/10621* (2013.01)

(58) Field of Classification Search
USPC .......................................................... 257/706
See application file for complete search history.

(56) References Cited

U.S. PATENT DOCUMENTS

| | | | |
|---|---|---|---|
| 2006/0035410 A1 | 2/2006 | Shiffer | |
| 2007/0164423 A1* | 7/2007 | Standing | H01L 24/73 257/E21.705 |
| 2011/0097855 A1* | 4/2011 | Otremba | H01L 21/565 438/123 |
| 2012/0001339 A1 | 1/2012 | Malatkar | |
| 2012/0161301 A1* | 6/2012 | Huang | H01L 24/20 257/E21.511 |
| 2019/0051741 A1* | 2/2019 | Tung | H01L 29/41775 |
| 2019/0189564 A1 | 6/2019 | Guzek | |
| 2021/0125891 A1* | 4/2021 | Kajihara | H01L 23/3135 |

FOREIGN PATENT DOCUMENTS

| | | | | |
|---|---|---|---|---|
| CN | 108962863 | A | | 12/2018 |
| CN | 111244074 | A | | 6/2020 |
| CN | 111683455 | A * | 9/2020 | ............... H01R 4/04 |
| DE | 102011013449 | A1 | | 9/2012 |
| EP | 3709777 | A1 | | 9/2020 |
| GB | 9223653 | | | 12/1992 |
| JP | H09205264 | A | | 8/1997 |
| JP | H1075021 | A | | 3/1998 |
| JP | 10321987 | A * | 12/1998 | |
| JP | H10321987 | A | | 12/1998 |
| JP | 2004363364 | A | | 12/2004 |
| JP | WO2014125973 | A1 | | 2/2017 |

OTHER PUBLICATIONS

State Intellectual Property Office of the People's Republic of China, Office Action and Search Report Issued in Application No. 202180004494.9, Mar. 17, 2023, 4 pages. (Submitted with Machine Translation).
State Intellectual Property Office of the People's Republic of China, Office Action and Search Report Issued in Application No. 202210358136.4, Nov. 10, 2023, 16 pages. (Submitted with Machine Translation).
State Intellectual Property Office of the People's Republic of China, Office Action and Search Report Issued in Application No. 202210358136.4, May 24, 2023, 15 pages. (Submitted with Machine Translation).
International Search Report and Written Opinion of the corresponding PCT application No. PCT/CN2021/091952 mailed on Jan. 30, 2022.
State Intellectual Property Office of the People's Republic of China, Office Action and Search Report Issued in Application No. 202180004494.9, Jan. 5, 2023, 12 pages. (Submitted with Machine Translation).
State Intellectual Property Office of the People's Republic of China, Second Office Action Issued in Application No. 202180004494.9, Mar. 17, 2023, 7 pages. (Submitted with Machine Translation).
United States Patent and Trademark Office, Final Office Action Issued in U.S. Appl. No. 17/567,845, Dec. 20, 2023, 16 pages.
State Intellectual Property Office of the People's Republic of China, Decision of Rejection Issued in Application No. 202210358136.4, Feb. 18, 2024, 14 pages. (Submitted with Machine Translation).
United States Patent and Trademark Office, Advisory Action Issued in U.S. Appl. No. 17/567,845, Mar. 1, 2024, 5 pages.
United States Patent and Trademark Office, Second Non-Final Office Action Issued in U.S. Appl. No. 17/567,845, Mar. 29, 2024, 24 pages.

* cited by examiner

NITRIDE-BASED SEMICONDUCTOR MODULE AND METHOD FOR MANUFACTURING THE SAME

FIELD OF THE INVENTION

The present invention generally relates to an electronic device packaging. More specifically, the present invention relates to a nitride-based semiconductor module including a nitride semiconductor device fitted in a printed circuit board (PCB) and to methods for manufacturing the PCB and the semiconductor device.

BACKGROUND OF THE INVENTION

Nitride semiconductor device such as gallium nitride (GaN) devices are prevalent in developments in semiconductor technologies and devices such as high power switching and high frequency applications. Conventionally, a nitride semiconductor device is packaged in a leaded or leadless package and assembled in a printed circuit board (PCB) by means of through-hole mounting or surface-mount mounting. Both types of processes require use of solder to provide electrical connection between the components and the PCB. Due to the mismatch between coefficients of thermal expansion of the soldering joint and the PCB, the soldering joint may be degraded and have reliability problems in power cycling. The thermal dissipation paths through the PCB are not sufficient to dissipate heat generated by the devices for high power switching and high frequency applications. Furthermore, the lead of leaded package have parasitic impedance and reactance that limit the high frequency performance. Therefore, there is a need to improve package designs for nitride semiconductor devices, thereby making them more flexible for mass production and more reliable.

SUMMARY OF THE INVENTION

An object of the present disclosure is to provide an electronic package and a method for manufacturing the same, which can address the above said reliability and parasitic impedance and reactance issues.

In accordance with one aspect of the subject application, a nitride-based semiconductor module comprising a nitride-based device removably pressed-fit in a cavity formed in a printed circuit board and methods for manufacturing the same are provided. The nitride-based semiconductor device and the cavity of the printed circuit board can cooperate with each other and act as an electrical plug and an electrical socket respectively. Soldering the nitride-based device on the printed circuit board can be avoided. Therefore, the packaging process can be more flexible and reliability issues with solder joints can be eliminated. Moreover, heatsink can be mounted on top and/or bottom of the semiconductor device after being received in cavity of the printed circuit board. Thermal dissipation efficiency can be greatly enhanced.

In accordance with another aspect of the subject application, the semiconductor device comprises: a nitride-based chip having an active surface formed with a plurality of conductive pads and a passive surface opposite to the active surface; an enclosure enclosing the nitride-based chip and having a top surface, a bottom surface and a plurality of side surfaces; and a plurality of conductive paths configured for electrically connecting the nitride-based chip to an external system, respectively having a plurality of exterior conductive contacts exposed on the plurality of side surfaces and extending over and along the plurality of side surfaces from the top surface to the bottom surface of the enclosure. The enclosure has a shape conformal to a shape substantially conformal to a shape of the nitride-based chip to achieve a chip-scale package. The plurality of exterior conductive contacts are electrically couplable with a plurality of interior conductive leads in a cavity of a printed circuit board such that the nitride-based semiconductor device can act as an electrical plug cooperating an electrical socket acted by the cavity of the printed circuit board.

In accordance with yet another aspect of the subject application, the printed circuit board comprises: an upper surface; a lower surface opposite to the upper surface; one or more substrate layers arranged between the upper surface and the lower surface; a cavity having one or more interior sidewalls being substantially perpendicular to the upper and lower surfaces; and a plurality of interior conductive leads fixed on and extending from the upper surface of the printed circuit board and bending into the cavity. The cavity of the printed circuit board has a shape conformal to a shape of an enclosure of the nitride-based semiconductor device such that the nitride-based semiconductor device can be removably press-fitted into the cavity of the printed circuit board. The plurality of interior conductive leads in the cavity of the printed circuit board are configured to be resiliently contactable to and electrically couplable with a plurality of exterior conductive contacts of the nitride-based semiconductor device such that the cavity can act as an electrical socket cooperating with an electrical plug acted by the nitride-based semiconductor device.

BRIEF DESCRIPTION OF THE DRAWINGS

Preferred embodiments of the present disclosure are described in more detail hereinafter with reference to the drawings, in which.

Figure 1A:
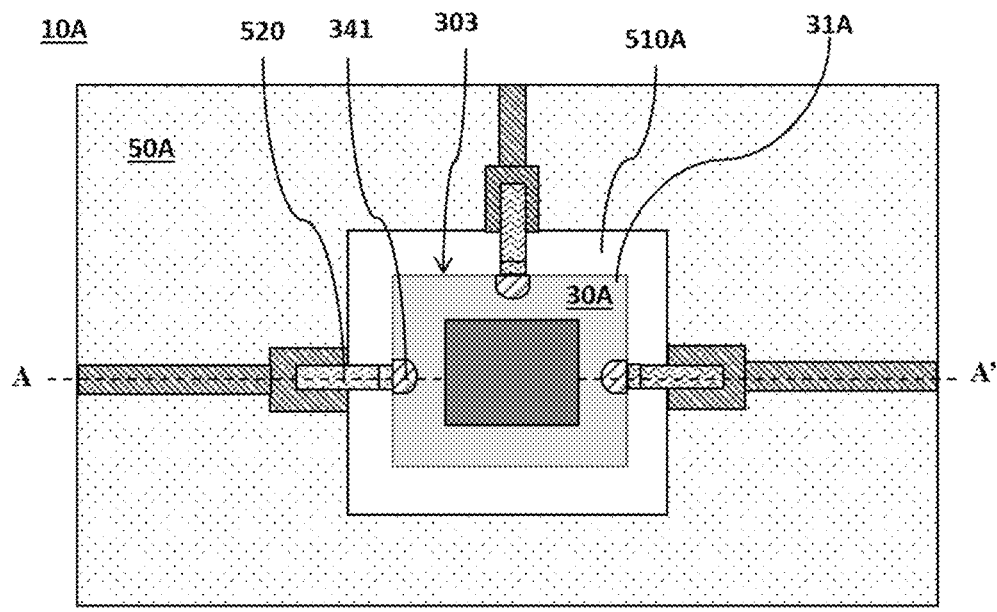
FIG. 1A is a simplified top view of a semiconductor module according to an embodiment of the present disclosure.

It should be noted that various features may not be drawn to scale. In fact, the dimensions of the various features may be arbitrarily increased or reduced for clarity of discussion.

DETAILED DESCRIPTION

Preferred embodiments of the present disclosure will be readily understood from the following detailed description taken in conjunction with the accompanying drawings. Common reference numerals are used throughout the drawings and the detailed description to indicate the same or similar components.

Spatial descriptions, such as "above," "below," "up," "left," "right," "down," "first," "second," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, a semiconductor module comprising a semiconductor device removably pressed-fit in a printed circuit board and methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
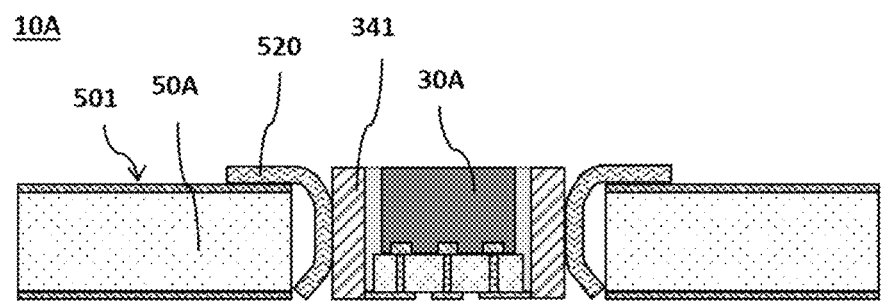
FIG. 1B is a cross-sectional view of the semiconductor module taken along the cutting line A-A' in FIG. 1A.

FIG. 1A is a simplified top view of a semiconductor module 10A according to an embodiment of the present disclosure, and FIG. 1B is a cross-sectional view of the semiconductor module 10A taken along the cutting line A-A' in FIG. 1A.

The semiconductor module 10A may comprise a printed circuit board 50A. The printed circuit board 50A may be a multi-layer board with conductive layers that are patterned and formed between substrate layers that can be fiberglass or other insulating substrate layers. The printed circuit board 50A may have a cavity 510A and a plurality of interior conductive leads 520 extending from a surface 501 of the printed circuit board 50A and bending into the cavity 510A.

The semiconductor device 30A may have an enclosure 31A and a plurality of exterior conductive contacts 341 exposed on a plurality of side surfaces 303 of the enclosure 31A.

The cavity 510A of the printed circuit board 50A and the enclosure 31A of semiconductor device 30A may have their shapes conformal to each other such that the semiconductor device 30A may be removably press-fitted into the cavity 510A of the printed circuit board 50A.

The plurality of exterior conductive contacts 341 of the semiconductor may be configured to be resiliently contactable to and electrically couplable with the plurality of interior conductive leads 520 in the cavity 510A of the printed circuit board 50A such that the semiconductor device 30A may act as an electrical plug cooperating with the cavity 510A which act as an electrical socket.

Figure 2:
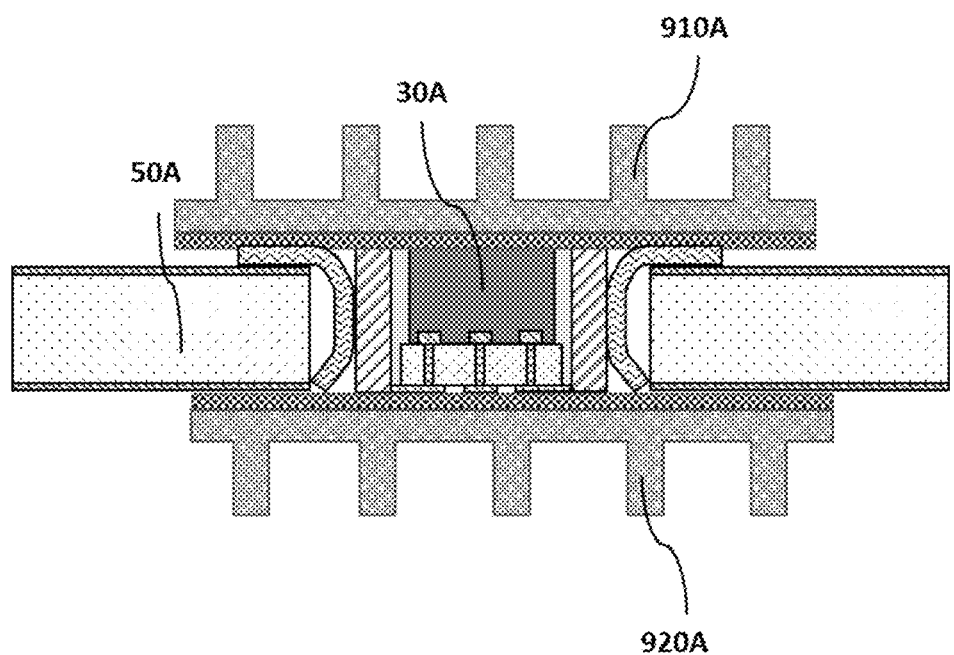
FIG. 2 is a cross-sectional view of an electronic assembly mounted with heatsinks according to an embodiment of the subject application.

Referring to FIG. 2. In some embodiments, after the semiconductor device 30A being fitted into the cavity 510A of the printed circuit board 50A, a first heatsink 910A may be mounted on a top surface of the semiconductor device 30A and a second heatsink 920A on a bottom surface of the semiconductor device 30A.

Figure 3A:
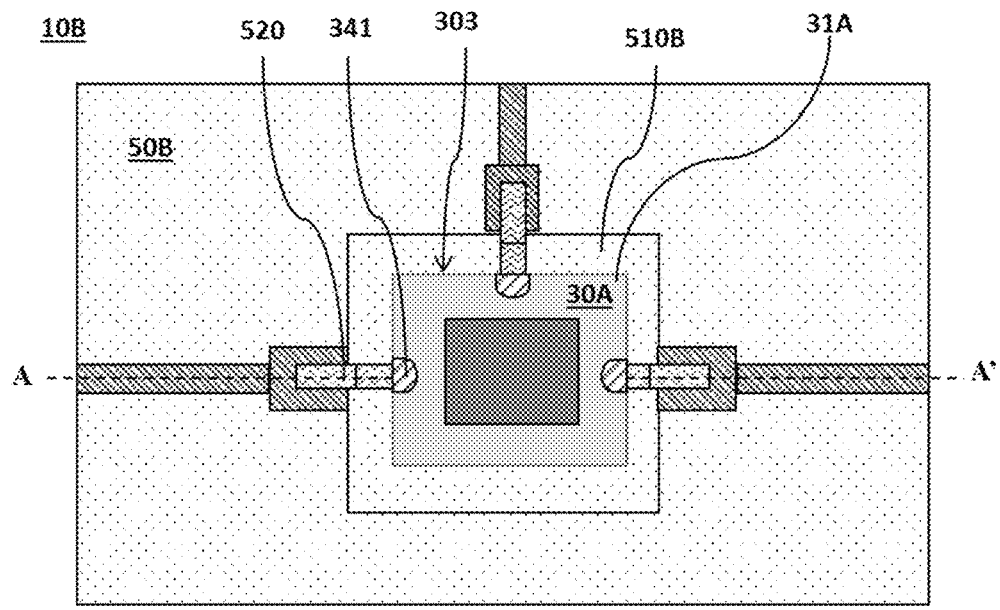
FIG. 3A is a simplified top view of semiconductor module according to another embodiment of the present invention and FIG. 3B is a cross sectional view taken along the cutting line A-A' in the FIG. 3A.
Figure 3B:
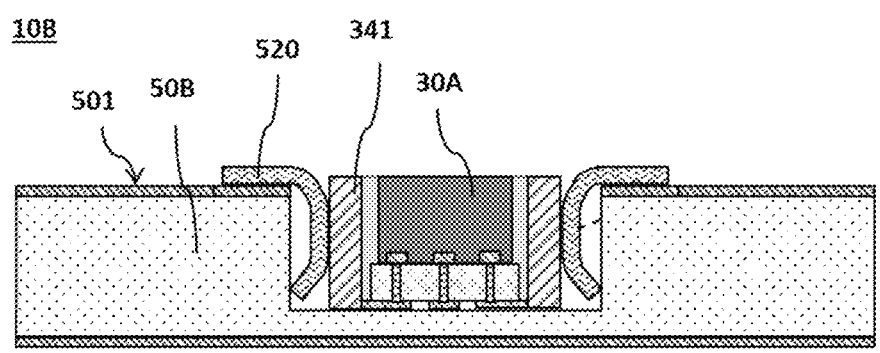

FIG. 3A is a simplified top view of semiconductor module 10B according to another embodiment of the present invention and FIG. 3B is a cross sectional view taken along the cutting line A-A' in the FIG. 3A. The semiconductor module 10B of FIGS. 3A-3B is similar to the semiconductor module 10A of FIGS. 1A-1B except for that the semiconductor module 10B comprises a printed circuit board 50B having a cavity 510B that has a blind-hole structure. For simplicity, identical elements in FIGS. 3A-3B and FIGS. 1A-1B are given the same reference numerals and will not be further described in details.

Figure 4:
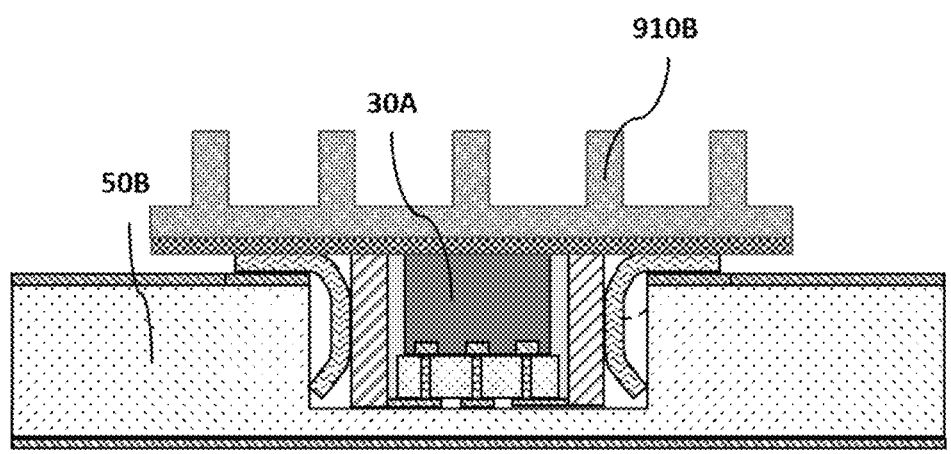
FIG. 4 is a cross-sectional view of an electronic assembly mounted with heatsink according to another embodiment of the subject application.

Referring to FIG. 4. In some embodiments, after the semiconductor device 30A being fitted into the cavity 510B of the printed circuit board 50B, a heatsink 910B may be mounted on a top surface of the semiconductor device.

It should be understood that the semiconductor module may further comprise other electronic components mounted to the printed circuit board. The other electronic components may include semiconductor or IC devices of various kinds, transistors, diodes, passive electronic components such as resistors, capacitors, resistor packs, inductors, transformers, and other components such as connectors, jumper wires, posts, handles, guides, mechanical supports, and mechanical devices.

Figure 5A:
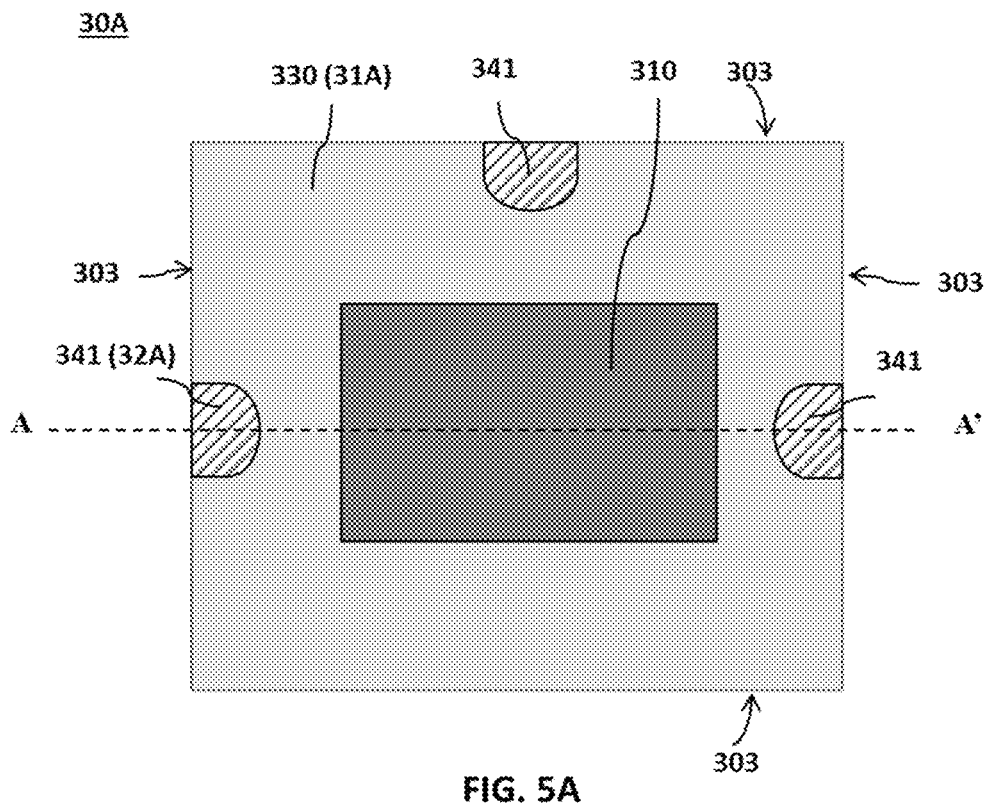
FIG. 5A shows more details of the top view the semiconductor device in FIG. 1A.
Figure 5B:
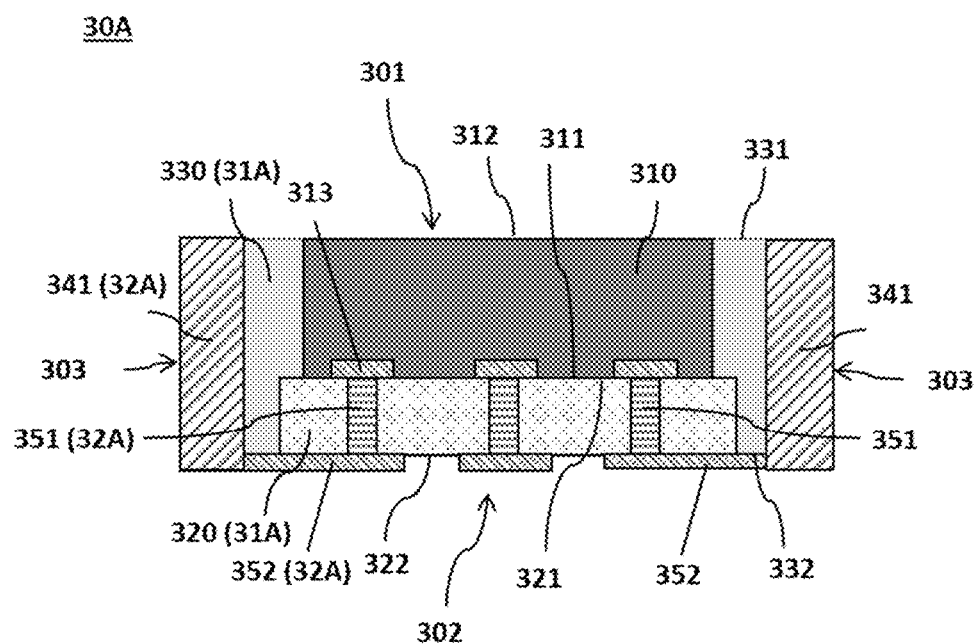
FIG. 5B shows more details of the cross-sectional view of the semiconductor device in FIG. 1B.

FIG. 5A shows more details of the top view the semiconductor device 30A of FIGS. 1A, and FIG. 5B shows more details of the cross-sectional view of the semiconductor device 30A.

The semiconductor device 30A may comprise a semiconductor chip 310, an enclosure 31A enclosing the semiconductor chip 310 and configured for protecting the semiconductor chip; and a plurality of conductive paths 32A configured for electrically connecting the semiconductor chip 310 to an external system (not shown).

The semiconductor chip may have an active surface 311 formed with a plurality of conductive pads 313; and a passive surface 312 opposite to the active surface.

In various embodiments, the semiconductor chip 310 may be, for example but not limited to, a nitride-based chip including a plurality of semiconductor layers, and the semiconductor layers may include materials such as gallium nitride (GaN), aluminum gallium nitride (AlGaN), silicon, or fluorine ions.

The enclosure 31A may having a top surface 301, a bottom surface 302 and a plurality of side surfaces 303. The enclosure 31A may comprise an insulating layer 320 positioned below the semiconductor chip 310, and an encapsulation layer 330 surrounding the semiconductor chip 310. The enclosure 31A may be generally formed in a shape substantially conformal to a shape of the semiconductor chip 310 to achieve a chip-scale package.

The insulating layer 320 may have a first surface 321 facing the semiconductor chip 310 and a second surface 322 opposite to the first surface 321. The first surface 321 of the insulating layer 320 may be in contact with the active surface 311 of the semiconductor chip 310.

The encapsulation layer 330 may have a first surface 331 adjacent to the passive surface 312 of the semiconductor chip 310 and a second surface 332 opposite to the first surface 331 and adjacent to the second surface 322 of the insulating layer 320.

The first surface 331 of the encapsulation layer 330 may be substantially coplanar with the passive surface 312 of the semiconductor chip 310. As such, the first surface 331 of the encapsulation layer 330 and the passive surface 312 of the semiconductor chip 310 form a top surface of the semiconductor device 30A.

The second surface 332 of the encapsulation layer 330 may be substantially coplanar with the second surface 322 of the insulating layer 320. As such, the second surface 332 of the encapsulation layer 330 and the second surface 322 of the insulating layer 320 form a bottom surface of the semiconductor device 30A.

In some embodiments, the plurality of side surfaces 303 may be substantially perpendicular to the active surface 311 of the semiconductor chip 310. That is, the side surfaces 303 may be substantially forming an angle of 90° with the active surface 311 of the semiconductor chip 310. In some embodiments, the side surfaces 303 may be slanted and forming an angle α with the active surface 311 of the semiconductor chip 310. The angle α may range from approximately 90° to approximately 135°.

The plurality of conductive paths 32A may comprise a plurality of exterior conductive contacts 341 exposed on and extending along the side surfaces 303 of the enclosure 31A for providing electrical connection to an external circuit (not shown). In some embodiments, the plurality of exterior conductive contacts 341 may be extending along the entire height of the side surfaces 303 from the bottom surface 302 to the top surface 301 of the enclosure 31A.

In some embodiments, the semiconductor device 310 may comprise one or more seed layers (not shown) respectively disposed under the one or more the exterior conductive contacts 341 for enhancing adhesion between the exterior conductive contacts 341 and the encapsulation layer.

The plurality of conductive paths 32A may further comprise a plurality of conductive vias 351 electrically coupled with the conductive pads 313 of the semiconductor chip 310 and extending substantially longitudinally from the active surface 311 of the semiconductor chip 310 to the bottom surface 302 of the enclosure 31A. The plurality of conductive vias may be formed through the insulating layer 320 from the first surface 321 to the second surface 322 of the insulating layer 320.

The plurality of conductive paths 32A may further comprise a plurality of conductive traces 352 respectively extending from the conductive vias 351 and substantially laterally over the bottom surface 302 to the side surfaces 303 of the enclosure 31A to electrically couple with exterior conductive contacts 341. The conductive traces 352 may be formed on the second surface 322 of insulating layer 320 and the second surface 332 of the encapsulation layer 330.

The conductive traces 352 and the exterior conductive contacts 341 form a cup to receive the semiconductor chip. The cup formed by the conductive traces 352 and the exterior conductive contacts 341 may surround/enclose the semiconductor chip. The cup formed by the conductive traces 352 and the exterior conductive contacts 341 may surround/enclose the insulating layer 320. The cup formed by the conductive traces 352 and the exterior conductive contacts 341 may surround/enclose the encapsulation layer 330.

Figure 6A:
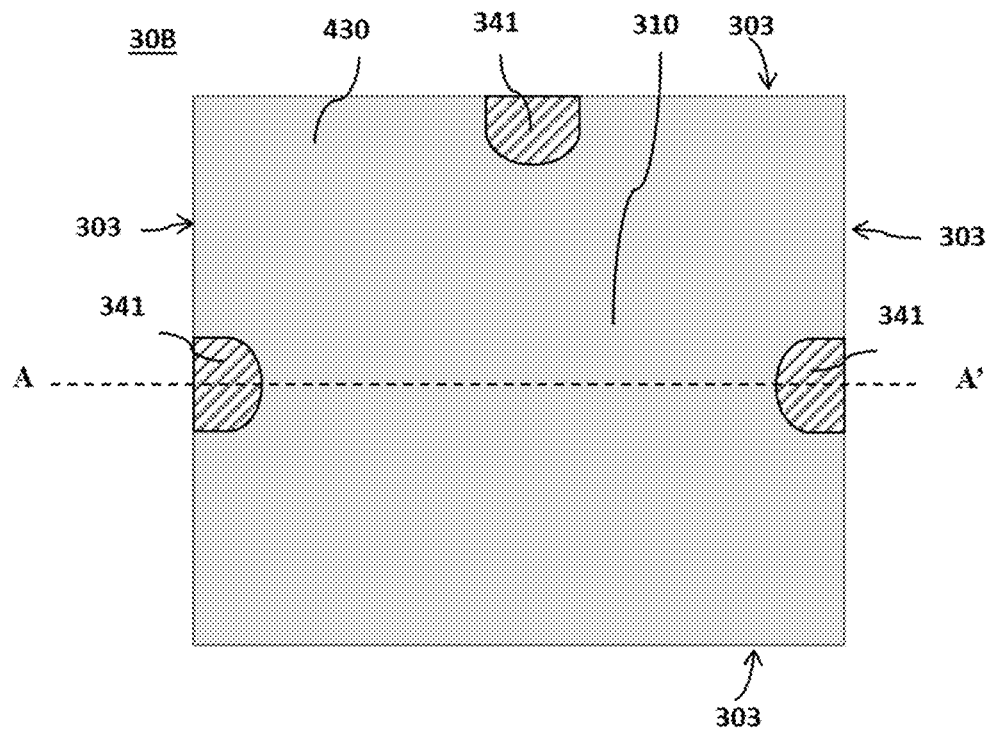
FIG. 6A is a top view of a semiconductor device according to another embodiment of the present invention and FIG. 6B is a cross sectional view taken along the cutting line A-A' in the FIG. 6A.
Figure 6B:
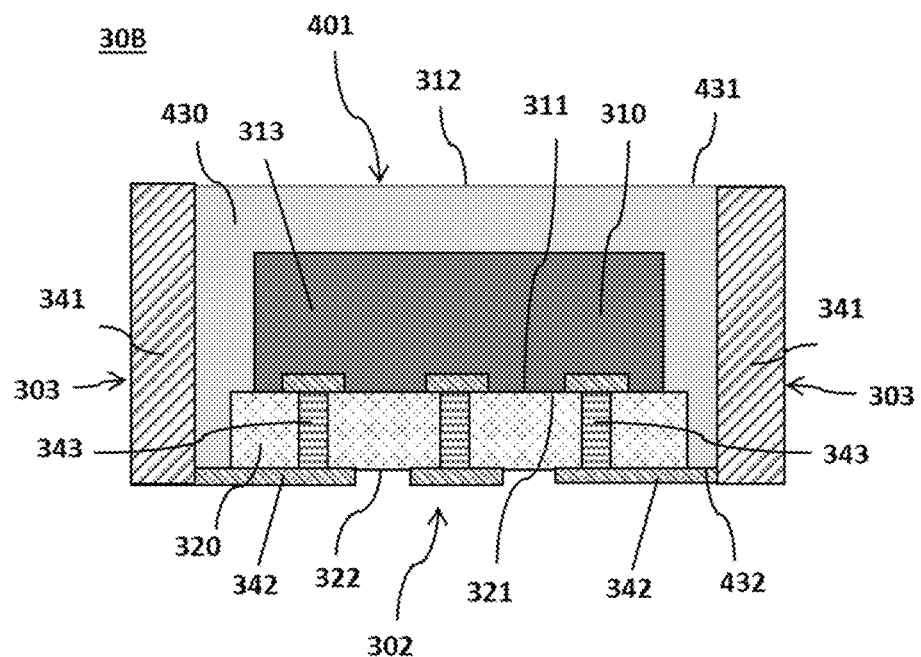

FIG. 6A is a top view of a semiconductor device 30B according to another embodiment of the present invention and FIG. 6B is a cross sectional view taken along the cutting line A-A' in the FIG. 6A. The semiconductor device 30B of FIGS. 6A-6B is similar to the semiconductor device 30A of FIGS. 5A-5B except for that its encapsulation layer 430 is configured to completely encapsulate the semiconductor chip 310. For simplicity, identical elements in FIGS. 6A-6B and FIGS. 5A-5B are given the same reference numerals and will not be further described in details.

As shown in FIGS. 6A and 6B, the encapsulation layer 430 may have a first surface 431 above the passive surface 312 of the semiconductor chip and a second surface 432 opposite to the first surface 431 and adjacent to the second surface 322 of the insulating layer 320. As such, the first surface 431 of the encapsulation layer form a top surface of the semiconductor device 30B (or enclosure).

FIGS. 7A, 7B, 7C, 7D, 7E, 7F, 7G, and 7H depict steps of a method for manufacturing a plurality of semiconductor devices according to the embodiment of FIGS. 5A-5B. For simplicity, only two semiconductor devices are shown in this embodiment. It should be understood that the method may be used for manufacturing a batch of any number of semiconductor devices.

Figure 7A:
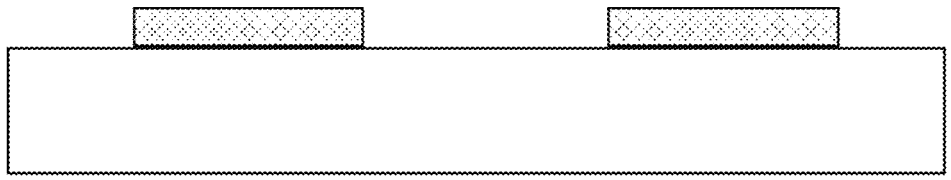
FIG. 7A, FIG. 7B, FIG. 7C, FIG. 7D, FIG. 7E, FIG. 7F, FIG. 7G, and FIG. 7H depict steps of a method for manufacturing a plurality of semiconductor devices according to the embodiment of FIG. 5A and FIG. 5B.

In the step illustrated in FIG. 7A, a baseplate is provided and applied with a plurality of insulating adhesives. The baseplate may comprise, but not limited to, a silicon (Si) or silicon carbide (SiC) substrate. The insulating adhesives may be in a form of paste applied on the baseplate by dispensing or printing processes. Alternatively, the insulating adhesives may be in a form of films applied on the baseplate by pick-and-place process.

Figure 7B:
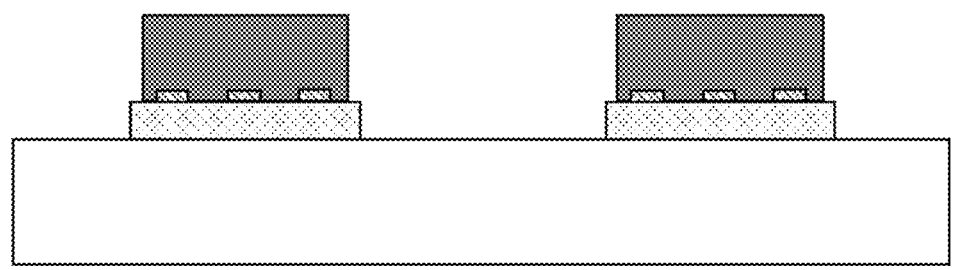

In the step illustrated in FIG. 7B, a plurality of semiconductor chips are flip-chip boned on the insulating adhesives respectively with their conductive pads facing the insulating adhesives. The insulating adhesives may then be cured to secure the semiconductor chips on the baseplate and form a plurality of insulating layers under the semiconductor chips respectively.

Figure 7C:
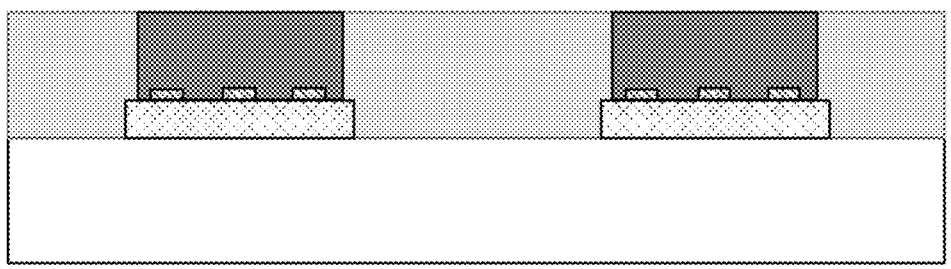

In the step illustrated in FIG. 7C, encapsulant may be applied to form encapsulation layer to surround the plurality of semiconductor chips and over the insulating layer. The encapsulation layer may have a first surface adjacent to and substantially coplanar to the passive surfaces of the semiconductor chips; and a second surface adjacent to and substantially coplanar with the second surface of the insulating layer. The encapsulation layer may be applied to surround semiconductor chips without covering the passive surfaces of the semiconductor chips. Alternatively, the encapsulation layer may be applied to completely cover the semiconductor chips and then a top portion of the encapsulation layer is removed to expose the passive surfaces of the semiconductor chips.

Figure 7D:
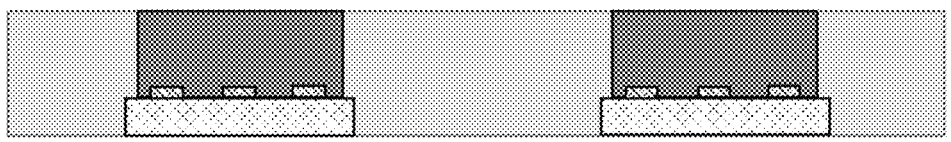

In the step illustrated in FIG. 7D, the baseplate is removed, leaving the second surface of the insulating layers exposed such that the second surface of the insulating layers and the second surface of the encapsulation layer together form bottom surfaces of the semiconductor devices.

Figure 7E:
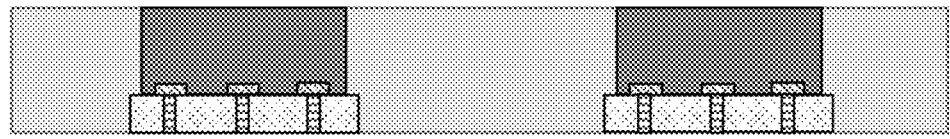

In the step illustrated in FIG. 7E, one or more conductive vias are formed through the insulating later such that the conductive vias substantially longitudinally extend from the first surface to the second surface of the insulating layer and electrically connected to the one or more conductive pads of the semiconductor chips respectively.

The formation of conductive vias may comprise: forming through holes in the insulating layer by a lithographic process and etching process; forming an oxide liner on the sidewalls of the through holes; filling the through holes with conductive material such as metal, and then polishing to remove excess metal outside the through holes.

Figure 7F:
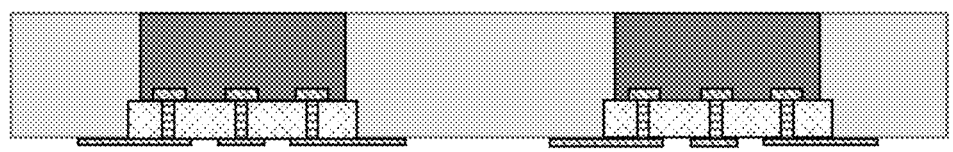

In the step illustrated in FIG. 7F, one or more conductive traces are formed on the second surface of the insulating layer and the second surface of the encapsulation layer such that the one or more conductive traces are electrically connected to the conductive vias respectively, and substantially laterally extend over the bottom surface of the semiconductor devices.

The conductive traces may be formed by deposition of a metallic materials using a chemical vapor deposition (CVD) process, an atomic layer deposition (ALD) process, a physical vapor deposition (PVD), another applicable process, or a combination thereof.

Figure 7G:
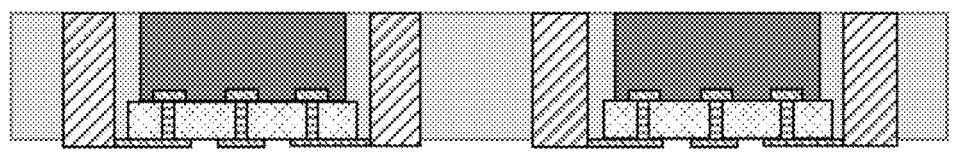

In the step illustrated in FIG. 7G, one or more conductive vias are formed in the encapsulation layer such that the one or more conductive vias are electrically connected to the one or more conductive traces, respectively, and substantially longitudinally extend though the encapsulation layer from the first surface to the second surface of the encapsulation layer.

The formation of conductive vias may comprise: forming through holes in the encapsulation layer by a lithographic process and etching process; forming an oxide liner on the sidewalls of the through holes; filling the through holes with conductive material such as metal, and then polishing to remove excess metal outside the through holes.

Figure 7H:
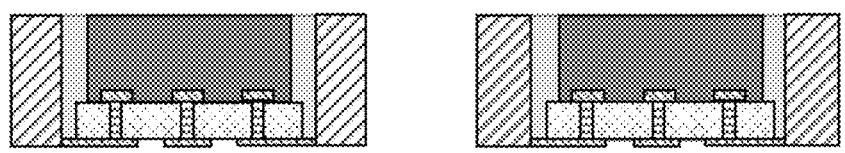
Figure 8A:
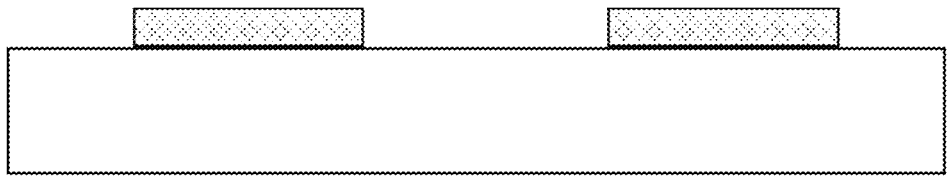
FIG. 8A, FIG. 8B, FIG. 8C, FIG. 8D, FIG. 8E, FIG. 8F, FIG. 8G, and FIG. 8H depict steps of a method for manufacturing a plurality of semiconductor devices according to the embodiment of FIG. 6A and FIG. 6B.
Figure 8B:
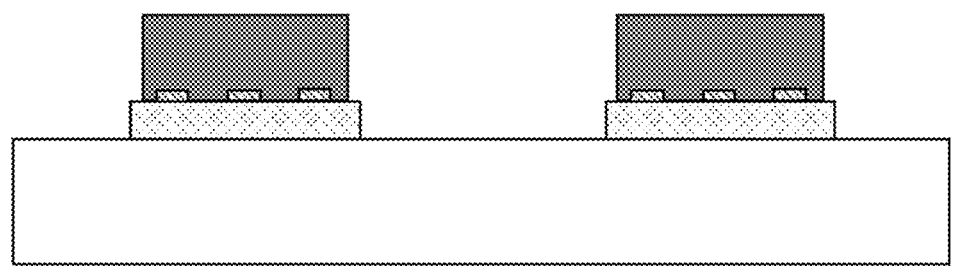
Figure 8C:
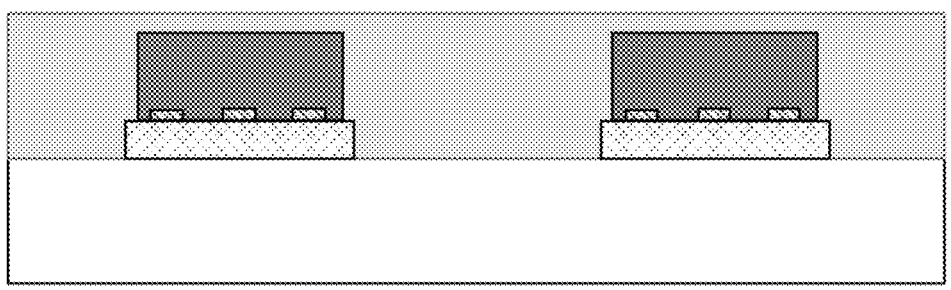
Figure 8D:
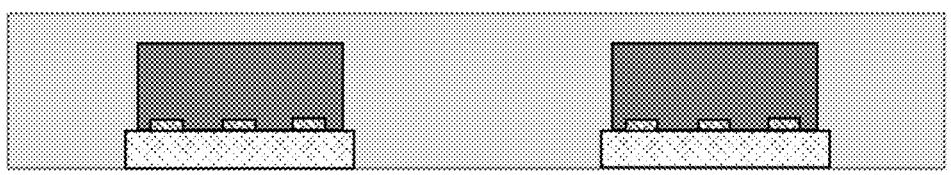
Figure 8E:
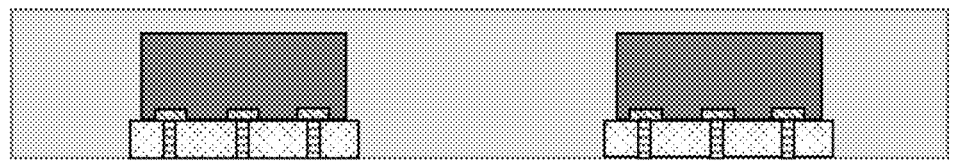
Figure 8F:
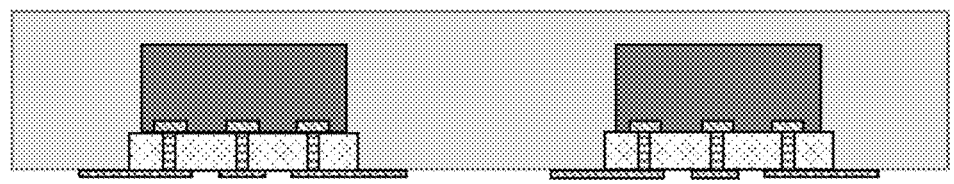
Figure 8G:
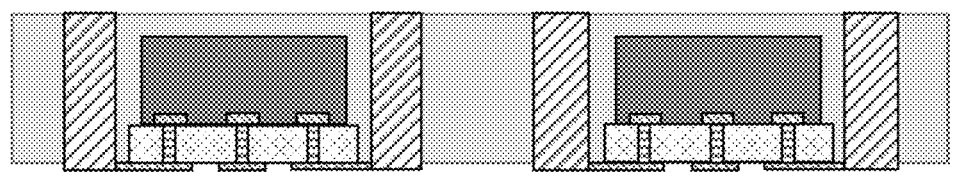
Figure 8H:
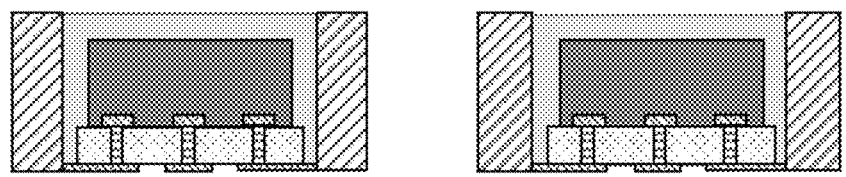

In the step illustrated in FIG. 7H, the semiconductor devices are separated from one another by dicing such that the one or more conductive vias are exposed on and extending substantially longitudinally along side surfaces of the semiconductor device to form one or more exterior conductive contacts 341.

FIGS. 8A, 8B, 8C, 8D, 8E, 8F, 8G, and 8H depict steps of a method for manufacturing a plurality of semiconductor devices according to the embodiment of FIGS. 6A-6B. The method as shown in FIGS. 8A, 8B, 8C, 8D, 8E, 8F, 8G, and 8H is similar to the method as shown in FIGS. 7A, 7B, 7C, 7D, 7E, 7F, 7G, and 7H, except for that in the step of FIG. 8C, the encapsulant may be applied to form encapsulation layer to completely cover the plurality of semiconductor chips and over the insulating layer such that the encapsulation layer may have a top surface above the passive surfaces of the semiconductor chips.

Figure 9A:
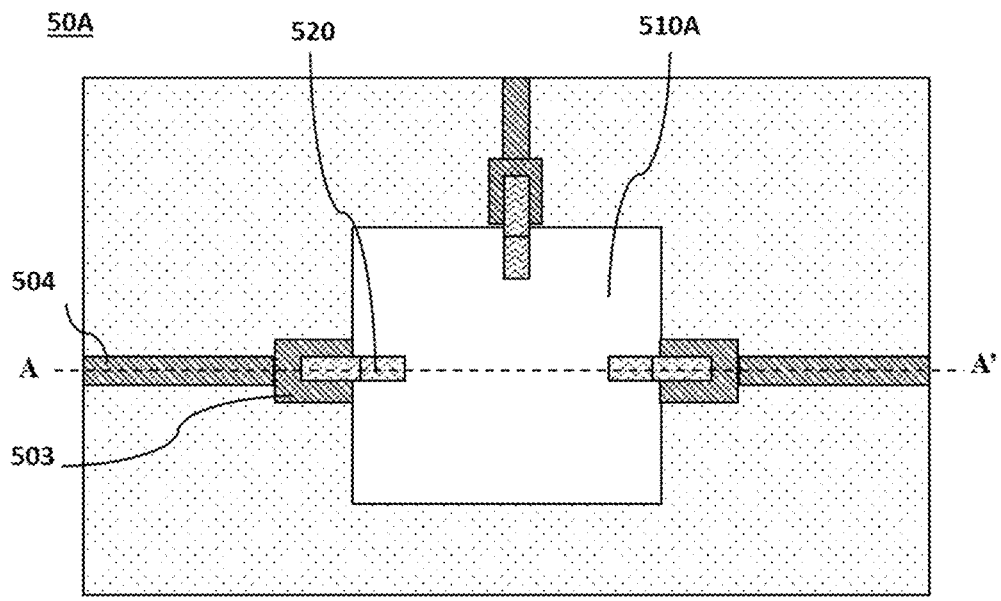
FIG. 9A shows more details of the top view of the printed circuit board of FIG. 1A
Figure 9B:
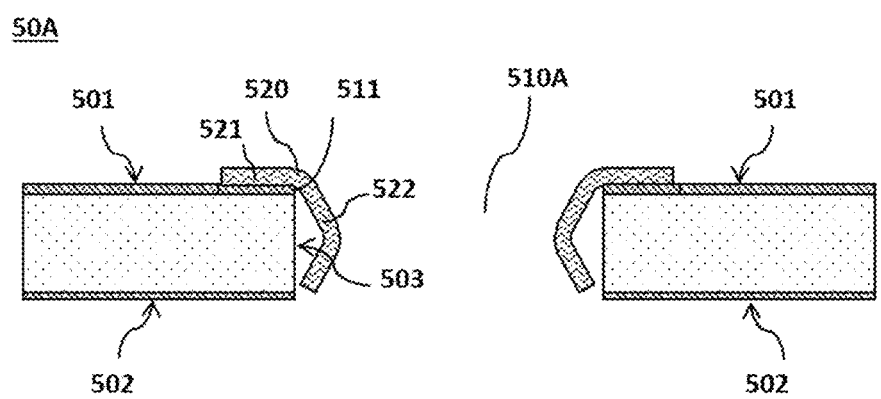
FIG. 9B shows more details of the cross-sectional view of the printed circuit board of FIG. 1B.

FIG. 9A shows more details of the top view of the printed circuit board 50A and FIG. 9B is a cross sectional view taken along the cutting line A-A' in the FIG. 9A.

The printed circuit board 50A may comprise an upper surface 501 and a lower surface 502 opposite to the upper surface. Each of the upper surface 501 and lower surface 502 may be deposited with a conductive metal layer patterned with pads 503 and traces 504.

In various embodiments, the printed circuit board may further comprise one or more substrate layers (not shown) arranged between the upper and lower surfaces, each having a conductive metal layer patterned with traces and pads on both sides and one or more vias for interconnecting the conductive traces and pads.

The cavity 510A may have a through-hole structure having a top opening at the upper surface of the printed circuit board 50A and a bottom opening at the lower surface of the printed circuit board 50A.

The plurality of interior conductive leads 520 of the printed circuit board 50A may be a plurality of conductive leads 520 electrically connected to the plurality of conductive pads 503 near the cavity 510A and on the upper surface 501 of the printed circuit board 50A. Each of the conductive leads 520 may have a first lead portion 521 fixed on a conductive pad 503 and extending from the conductive pad 503 to an edge 511 of the cavity 510A. Each of the conductive leads 520 may further have a second lead portion 522 bending from the first lead portion 521 and extending substantially longitudinally downward along an interior sidewall 503 into the cavity 510A. In some embodiments, each of the conductive leads may further have a third lead portion bending from the second lead portion and extending substantially laterally towards a central region of the cavity.

Figure 10A:
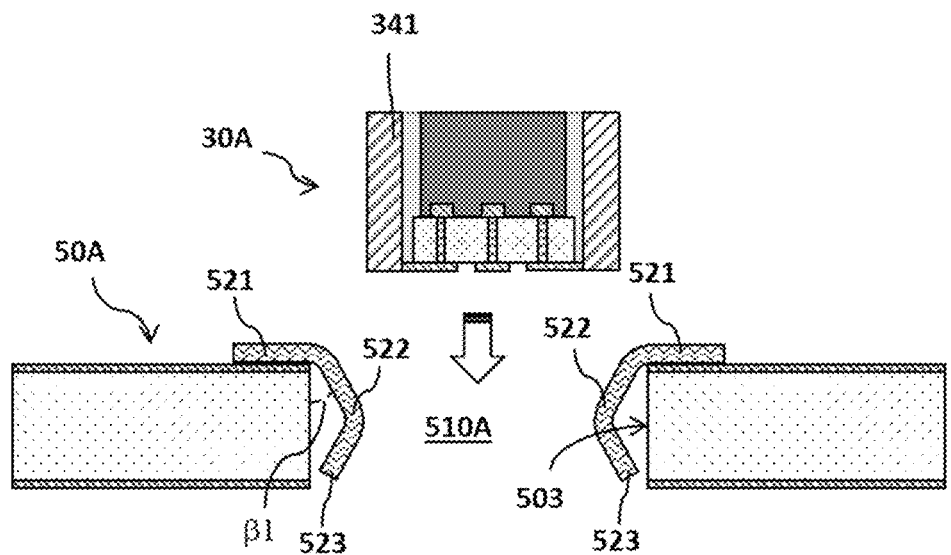
FIG. 10A and FIG. 10B illustrate how a semiconductor device is fitted into the printed circuit board of FIG. 9A and FIG. 9B.
Figure 10B:
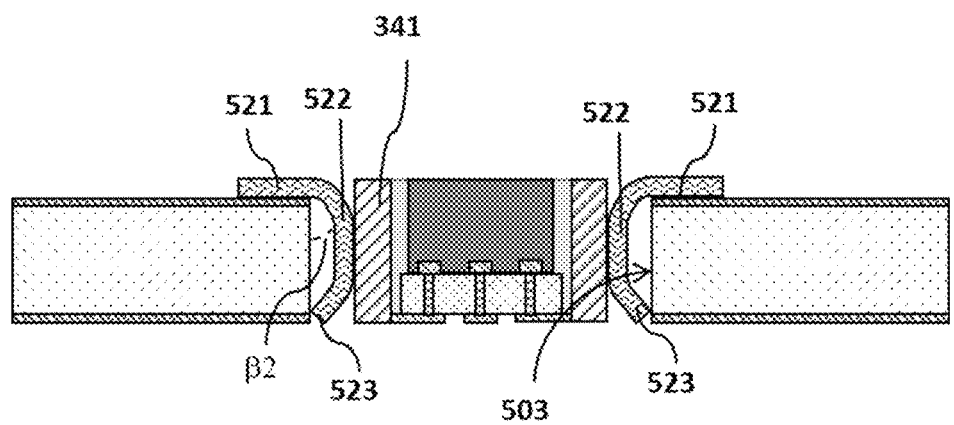

Referring to FIGS. 10A-10B. When a semiconductor device 30A is inserted into the cavity 510A of the printed circuit board 50A, the plurality of interior conductive leads 520 may be configured to make contact with a plurality of exterior conductive contacts 341 of the semiconductor device 30A. The plurality of interior conductive leads may be at a first state where they are not making contact with the exterior conductive contacts 341 of the semiconductor device 30A; and reversibly change to a second state where they are making contact with the exterior conductive contacts 341 of the semiconductor device 30A.

More specifically, the second lead portion 522 is elastically deformable to have a resilient contact with the exterior conductive contacts 341 of the semiconductor device when the semiconductor device 30A is inserted into the cavity. For example, the second lead portion 522 has a curved surface at the first state. When the semiconductor device 30A is inserted into the cavity 510A, the second lead portion 522 is pushed by the semiconductor device 30A and having a movable end 523 flushing against the interior sidewall 503 in the cavity 510A such that the second lead portion 522 is deformed to have a substantially flat surface coupling with the exterior conductive contacts 341 of the semiconductor device 30A.

Moreover, the conductive leads 520 may have their second lead portions 522 being bent at a first bending angle $\beta1$ from their first lead portions 521 at the first state; and their second lead portions 522 being bent at a second bending angle $\beta2$ smaller than the first bending angle $\beta1$ from their first lead portions 521 at the second state.

Figure 11A:
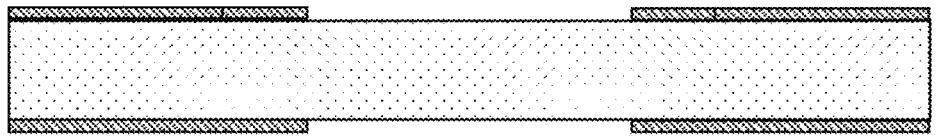
FIG. 11A, FIG. 11B and FIG. 11C depict steps of a method for manufacturing a printed circuit board according to the embodiment of FIG. 9A and FIG. 9B.
Figure 11B:
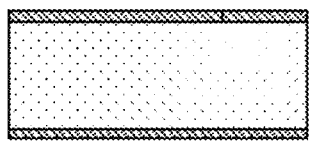
Figure 11B:
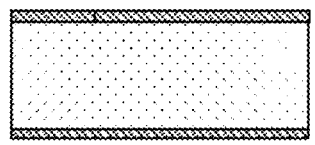
Figure 11C:
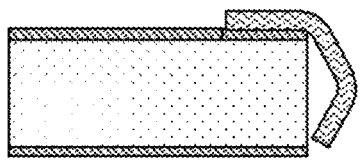
Figure 11C:
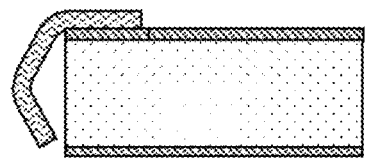

FIGS. 11A, 11B and 11C depict steps of a method for manufacturing a printed circuit board according to the embodiment of FIGS. 9A-9B.

In a step illustrated in FIG. 11A, a printed circuit board is provided with and patterned with conductive traces and pads on an upper surface and a bottom surface. The conductive traces and pads may be formed by copper plating and then do surface finish plating using gold, silver, tin, nickel, or various alloys.

In a step illustrated in FIG. 11B, a through-hole cavity is formed in the printed circuit board by machine cutting or laser drilling. That is, the cavity may have a top opening at an upper surface of the printed circuit board and a bottom opening at a lower surface of the printed circuit board.

In the step illustrated in FIG. 11C, a plurality of interior conductive leads are placed to a plurality of conductive pads near the cavity and fixed on the upper surface of the printed circuit board by soldering such that each of the conductive leads may have a first lead portion substantially laterally extending from the conductive pads to an edge of the cavity; and a second lead portion bending from the first lead portion and extending substantially longitudinally downward along an interior sidewall into the cavity. In some embodiments, each of the conductive leads may further have a third lead portion bending from the second lead portion and extending substantially laterally towards a central region of the cavity.

Figure 12A:
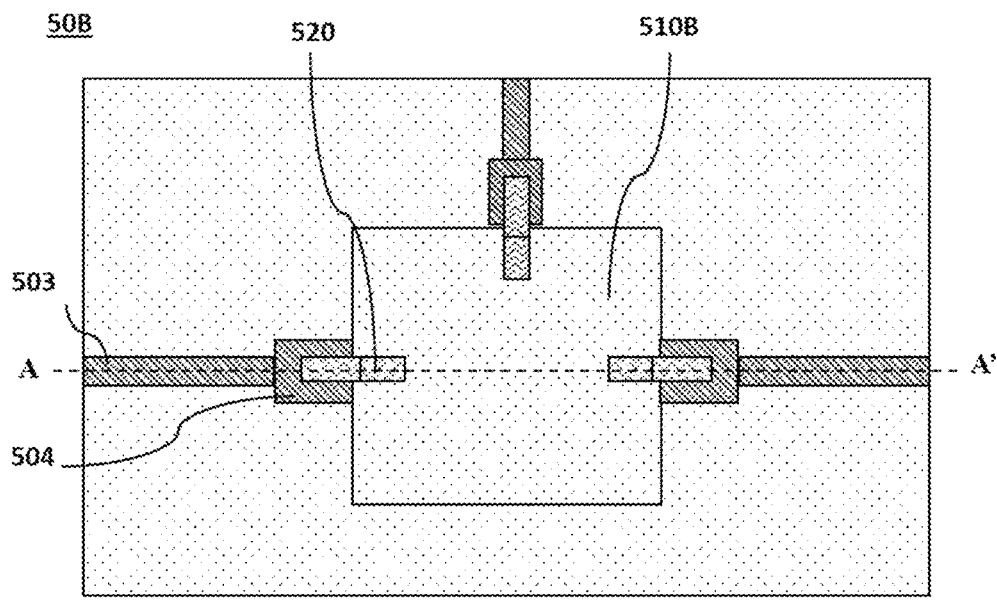
FIG. 12A shows more details of the top view of the printed circuit board of FIG. 2A
Figure 12B:
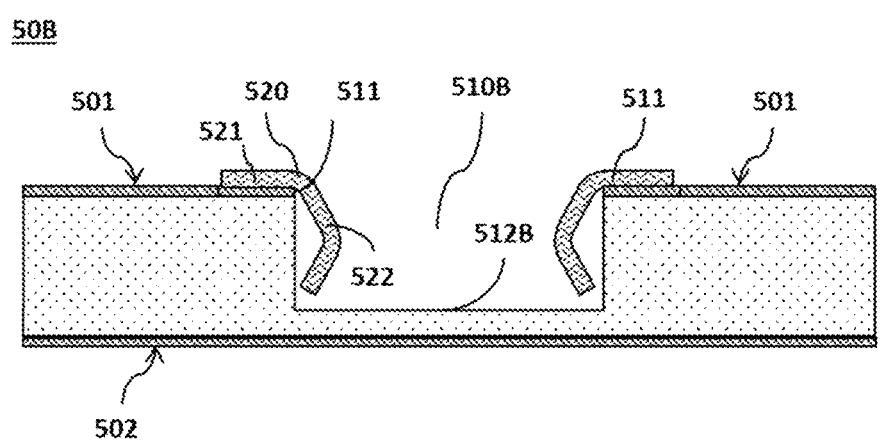
FIG. 12B shows more details of the cross-sectional view of the printed circuit board of FIG. 2B.

FIG. 12A shows more details of the top view of the printed circuit board 50B and FIG. 12B is a cross sectional view taken along the cutting line A-A' in the FIG. 12A. The printed circuit board 50B of FIG. 12A and FIG. 12B is similar to the printed circuit board 50A of FIG. 9A and FIG. 9B except for that the printed circuit board 50B comprise a cavity 510B that has a blind-hole structure. For simplicity, identical elements in FIG. 12A and FIG. 12B and FIG. 9A and FIG. 9B are given the same reference numerals and will not be further described in details.

As shown in FIG. 12A and FIG. 12B, the cavity 510B of the printed circuit board 700 may have a top opening at an upper surface 501 of the printed circuit board 50B and a bottom base 512B formed at a substrate layer between the upper and lower surfaces of the printed circuit board.

Figure 13A:
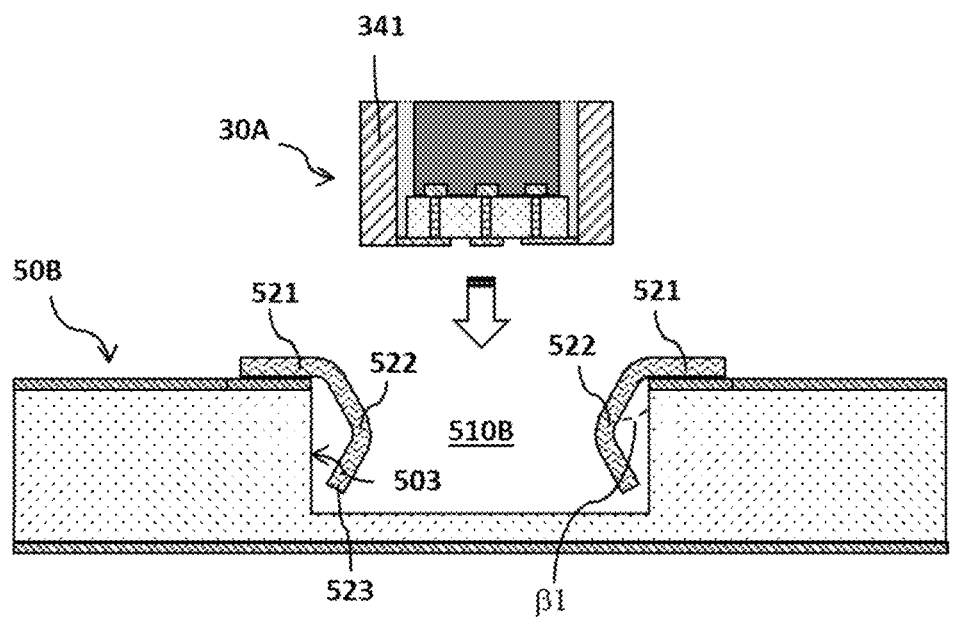
FIG. 13A and FIG. 13B illustrate how a semiconductor device is fitted into the printed circuit board of FIGS. 12A and 12B.
Figure 13B:
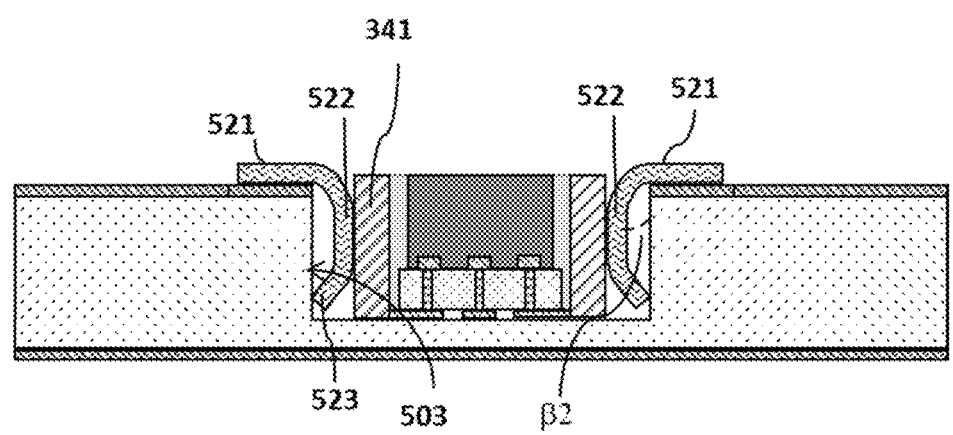

Referring to FIG. 13A and FIG. 13B, similarly, the cavity 510B may have an interior shape conformal to an exterior shape of a semiconductor device 30A such that the semiconductor device 30A can be removably fitted into the cavity 510B.

Figure 14A:
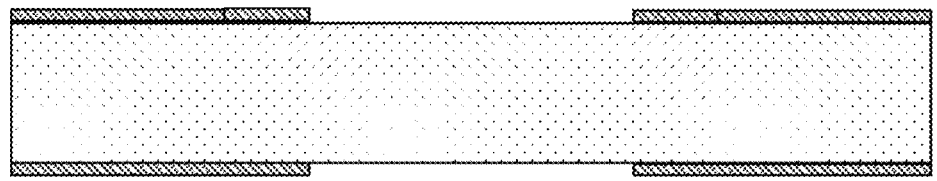
FIG. 14A, FIG. 14B and FIG. 14C depict steps of a method for manufacturing a printed circuit board according to the embodiment of FIG. 12A and FIG. 12B.
Figure 14B:
Figure 14C:
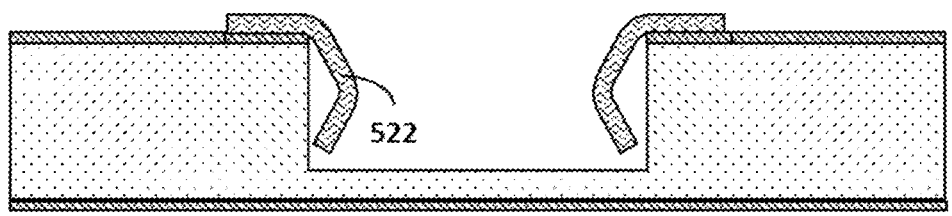

FIGS. 14A, 14B and 14C depict steps of a method for manufacturing a printed circuit board according to the embodiment of FIG. 12A and FIG. 12B. The method as shown in FIGS. 14A, 14B and 14C is similar to the method as shown in FIGS. 11A, 11B and 11C, except for that in the step of FIG. 14B, a blind-hole cavity is formed in the printed circuit board by machine cutting or laser drilling. That is, the cavity may be a blind hole having a top opening at the upper surface of the printed circuit board and a bottom base at a substrate layer between the upper and lower surfaces of the printed circuit board.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims.

The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A method for manufacturing one or more semiconductor devices, each suitable to be removably press-fitted into a cavity of a printed circuit board and act as an electrical plug to cooperate with an electrical plug acted by the cavity of the printed circuit board, the method comprising:

forming one or more enclosures enclosing one or more semiconductor chips, wherein each enclosure has a top surface, a bottom surface and a plurality of side surfaces; and forming a plurality of conductive paths in each enclosure for electrically connecting each semiconductor chip to an external system, wherein the plurality of conductive paths respectively having a plurality of exterior conductive contacts exposed on the plurality of side surfaces and extending over and along the plurality of side surfaces from the top surface to the bottom surface of the enclosure;

wherein the plurality of exterior conductive contacts are electrically couplable with a plurality of interior conductive leads in a cavity of a printed circuit board such that the semiconductor device acts as an electrical plug cooperating with an electrical socket formed by the cavity of the printed circuit board;

wherein a first heatsink is mounted on a top surface of the semiconductor device and a second heatsink is mounted on a bottom surface of the semiconductor device, and the first heatsink covers both the top surface of the semiconductor device and the interior conductive leads on the printed circuit board;

wherein the formation of the one or more enclosure comprises:
applying one or more insulating adhesives on a baseplate;
placing the one or more semiconductor chips on the one or more insulating adhesives respectively;
curing the one or more insulating adhesives to form one or more insulating layers below the one or more semiconductor chips respectively; and
applying an encapsulant to form one or more encapsulation layers surrounding the one or more semiconductor chips and covering the one or more insulating layers;
removing the baseplate such that the one or more insulating layers and the one or more encapsulation layers form the one or more enclosures enclosing the plurality of semiconductor chips respectively.

2. The method according to claim 1, wherein the formation of the plurality of conductive paths in each of the one or more enclosure comprising:
forming a plurality of first conductive vias through each of the one or more insulating layers such that the first conductive vias substantially longitudinally extend from a first surface to a second surface of the insulating layer and electrically connected to a plurality of conductive pads of the semiconductor chips respectively;
forming a plurality of conductive traces on the second surface of the insulating layer and a second surface of each of the one or more encapsulation layers such that the plurality of conductive traces are electrically connected to the plurality of first conductive vias respectively, and substantially laterally extend over the bottom surface of the enclosure;
forming a plurality of second conductive vias through the encapsulation layer such that the plurality of second conductive vias are electrically connected to the plurality of conductive traces respectively, and substantially longitudinally extend though the encapsulation layer from the top surface to the bottom surface of the enclosure; and
separating the one or more semiconductor devices from one another by dicing such that the one or more conductive vias are exposed to form one or more exterior conductive contacts.

3. The method according to claim 1, wherein the plurality of conductive traces and the plurality of exterior conductive contacts form cups to receive the semiconductor chips.

4. The method according to claim 3, wherein the cups formed by the plurality of conductive traces and the plurality of exterior conductive contacts surround/enclose the semiconductor chip.

5. The method according to claim 3, wherein the cups formed by the plurality of conductive traces and the plurality of exterior conductive contacts surround/enclose the insulating layer.

6. The method according to claim 3, wherein the cups formed by the plurality of conductive traces and the plurality of exterior conductive contacts surround/enclose the encapsulation layer.

7. The method according to claim 1, wherein each of the plurality of side surfaces is substantially perpendicular to an active surface of a corresponding one of the semiconductor chips.

8. The method according to claim 1, wherein the plurality of side surfaces are slanted and each forming an angle $\alpha$ with an active surface of a corresponding one of the semiconductor chips.

9. The method according to claim 1, wherein the semiconductor chips are GaN-based HEMT dies.

* * * * *